(12) United States Patent
Sheng et al.

(10) Patent No.: US 7,019,390 B2
(45) Date of Patent: Mar. 28, 2006

(54) SILICON NITRIDE INSULATING SUBSTRATE FOR POWER SEMICONDUCTOR MODULE

(75) Inventors: William W. Sheng, Commack, NY (US); Terence J. Clark, Lansdale, PA (US); James Fain, Doylestown, PA (US); Sylvester Karpchuck, Churchville, PA (US); Ronald P. Colino, Commack, NY (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 10/771,204

(22) Filed: Feb. 3, 2004

(65) Prior Publication Data

US 2005/0167696 A1    Aug. 4, 2005

(51) Int. Cl.
*H01L 23/02* (2006.01)
(52) U.S. Cl. ........................................ 257/678; 275/702
(58) Field of Classification Search ................ 257/678, 257/675, 706, 734, 779
See application file for complete search history.

(56) References Cited

U.S. PATENT DOCUMENTS

| | | | |
|---|---|---|---|
| 4,763,098 A * | 8/1988 | Glenn et al. ................... 338/4 |
| 5,238,884 A | 8/1993 | Sakai et al. |
| 5,698,896 A | 12/1997 | Komatsu et al. |
| 6,040,068 A | 3/2000 | Yasumoto et al. |
| 6,110,596 A | 8/2000 | Kasori et al. |
| 6,391,812 B1 | 5/2002 | Araki et al. |
| 6,400,164 B1 * | 6/2002 | Sampath ..................... 324/750 |
| 6,474,123 B1 * | 11/2002 | Kito et al. ................ 70/456 R |
| 6,765,292 B1 * | 7/2004 | Cheah et al. ............... 257/734 |
| 6,767,411 B1 * | 7/2004 | Yeh et al. ..................... 148/24 |
| 2002/0053720 A1 | 5/2002 | Boursat et al. |

* cited by examiner

*Primary Examiner*—Fetsum Abraham
(74) *Attorney, Agent, or Firm*—Brinks Hofer Gilson & Lione

(57) ABSTRACT

An aspect of the present invention provides a power module for automotive switching applications including a plurality of semiconductor chips and a unitary silicon nitride substrate. The plurality of semiconductor chips are attached to the silicon nitride substrate and the substrate is configured to have a thermal coefficient of expansion substantially the same as the plurality of semiconductor chips.

19 Claims, 2 Drawing Sheets

SILICON NITRIDE INSULATING SUBSTRATE FOR POWER SEMICONDUCTOR MODULE

BACKGROUND

1. Field of the Invention

The present invention generally relates to an electronic power module. More specifically, the invention relates to electronic power modules having a silicon nitride substrate for automotive applications.

2. Description of Related Art

Power modules including IGBT (insulated gate bipolar transistor), FREDs (fast recovery epitaxial diode), MOSFETs, and other semiconductor chips have been used in automotive applications for many years. The power modules must be able to operate at a high ambient temperature. In addition, the high power dissipation required by the power modules further increases the temperature variations affecting the components of the power module. With such large temperature swings, the difference in thermal expansion of the components in the power module often causes reliability issues. A major cause of reliability issues is due to warping of the substrate. Substrate warpage of even 250 microns across a die can present a problem. Typically, the printed solder paste thickness is only 125 microns thick. Therefore, a warpage of 250 microns would not allow the die to be placed flat on the solder print.

Many manufacturers have used smaller powered dies on multiple substrates to address the warpage problem. For example, four 50 Amp chips have been used on four separate substrates rather than a single 200 Amp chip on a single substrate as desired. However, using multiple substrates requires the use of a metal base plate which adds cost and complexity to the module. In addition, a thermal expansion mismatch between the die and substrate can also cause mechanical stress in the electrical connections thereby compromising reliability. Repetitive high power switching applications tend to increase temperature and shorten the life expectancy of solid-state power devices.

One application that subjects the power module to repetitive high power switching is the electric automobile application, especially when the electric vehicle is driven in a city where stopping at a red light every few minutes is typically required. The power required to accelerate a vehicle from a standing start is substantially greater than the power required to maintain a constant speed. Another example is an electric assisted automotive power steering system while in a parking maneuver. Quite often in this situation the tires come in contact with the curb. Tires contacting the curb drives the power assist system to provide maximum output until the controlling processor reacts to the "stall load" demand by reducing the amount of assist. Automotive applications typically require very high peak power demands followed by a short cool down in a repetitive cycle. To address the power dissipation problem caused by the frequent high power switching, power modules were designed with multiple chips and multiple substrates, as shown in FIG. 1.

FIG. 1 shows a IGBT module 10 with a first semiconductor chip 12 and a second semiconductor chip 26. The first semiconductor chip 12 is attached to a ceramic substrate 14. The ceramic substrate 14 includes a copper layer 16 that includes a circuit pattern (not shown). The first semiconductor chip 12 is attached to the copper layer 16 by wire bonds 20. In addition, substrate 14 has a copper layer 22 which can be used for grounding or thermal dissipation. The copper layer 22 is attached to a base plate 24. The base plate 24 acts as a foundation or support for all of the semiconductor components.

The second semiconductor chip 26 is attached to a separate second ceramic substrate 28. The second ceramic substrate 28 has a copper layer 30 which includes a circuit pattern (not shown). Second semiconductor chip 26 is electrically connected to the circuit pattern of copper layer 30 by wire bonds 32. The second substrate 28 also has a copper layer 34 for grounding, mechanical balancing, and dissipating heat. Copper layer 34 is also attached to base plate 24. Attached to the circuit pattern on copper layers 16, 30 are leads 42, 44, 46, 48 for connecting the IGBT module with other devices or circuits external of module 10. To improve the thermal dissipation and protect the components of module 10 a silicone gel 40 is disposed over the semiconductor chips 12, 26 to cover and protect them. In addition, an epoxy resin 38 is disposed on top of silicone gel 40 to further protect and seal module 10. The epoxy resin case 36 is attached to the base plate 24 and provides additional structural protection for the components of IGBT module 10.

The multiple ceramic substrates 14 and 28 help to mitigate thermal expansion problems. However, the multiple ceramic substrates also complicate the manufacture of module 10, add additional weight, and add significant cost to the module.

In view of the above, it is apparent that there exists a need for an improved power module for automotive applications that is easier to manufacture, weighs less, and has lower component costs.

SUMMARY

In satisfying the above need, as well as overcoming the enumerated drawbacks and other limitations of the related art, the present invention provides a power module for automotive switching applications including a plurality of semiconductor chips and a unitary silicon nitride substrate. The plurality of semiconductor chips are attached to the silicon nitride substrate and the substrate is configured to have a thermal coefficient of expansion substantially the same as the plurality of semiconductor chips.

In another aspect of the invention, at least one of the plurality of semiconductor chips is an IGBT semiconductor chip.

In another aspect of the invention, at least one of the plurality of semiconductor chips is a FRED semiconductor chip.

In yet another aspect of the invention the substrate includes a copper layer. The copper layer is between 0.1 and 0.5 mm thick and is actively brazed to the substrate. The plurality of semiconductor chips are attached to the copper layer by solder and connected to the circuit pattern of the copper layer by wire bonds.

In yet another aspect of the invention the substrate includes holes for fastening the substrate. The substrate may be fastened to a heat sink. Further, the housing of the power module is fastened to the substrate.

Further aspects, features and advantages of this invention will become readily apparent to persons skilled in the art after a review of the following description, with reference to the drawings and claims that are appended to and form a part of this specification.

DETAILED DESCRIPTION

Figure 1:
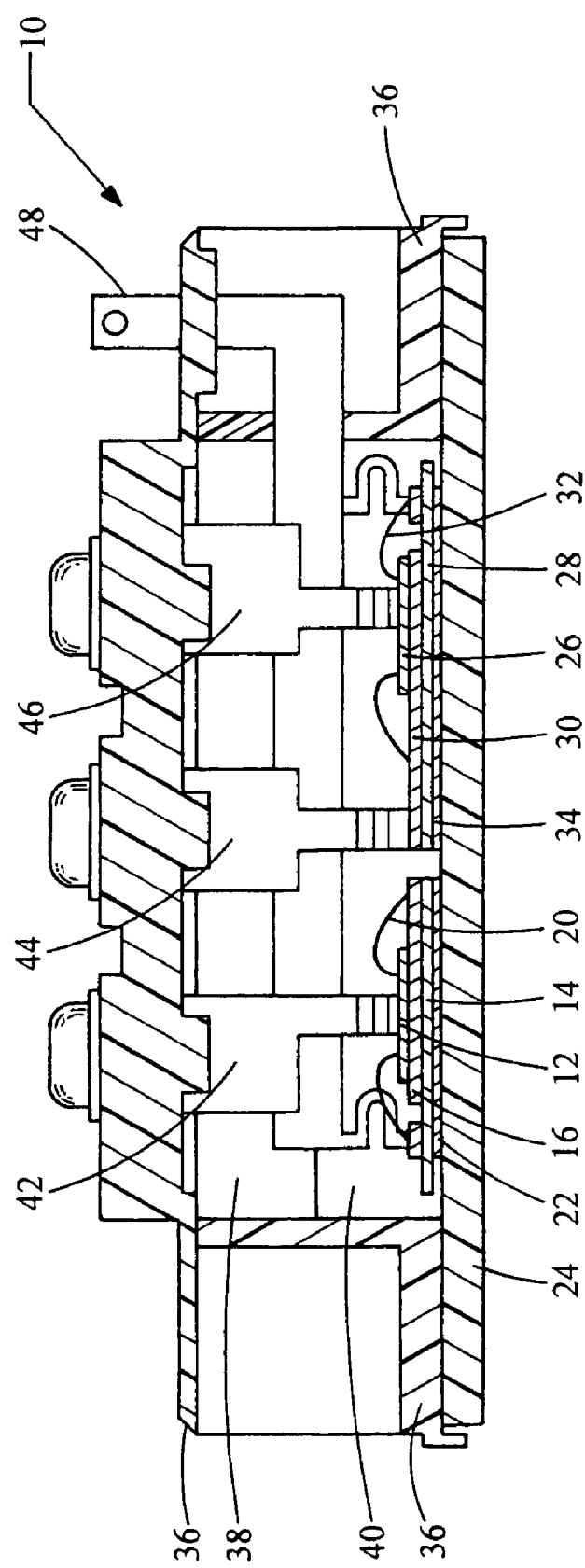
FIG. 1 is a side cutaway view of a prior art module using a conventional design.
Figure 2:
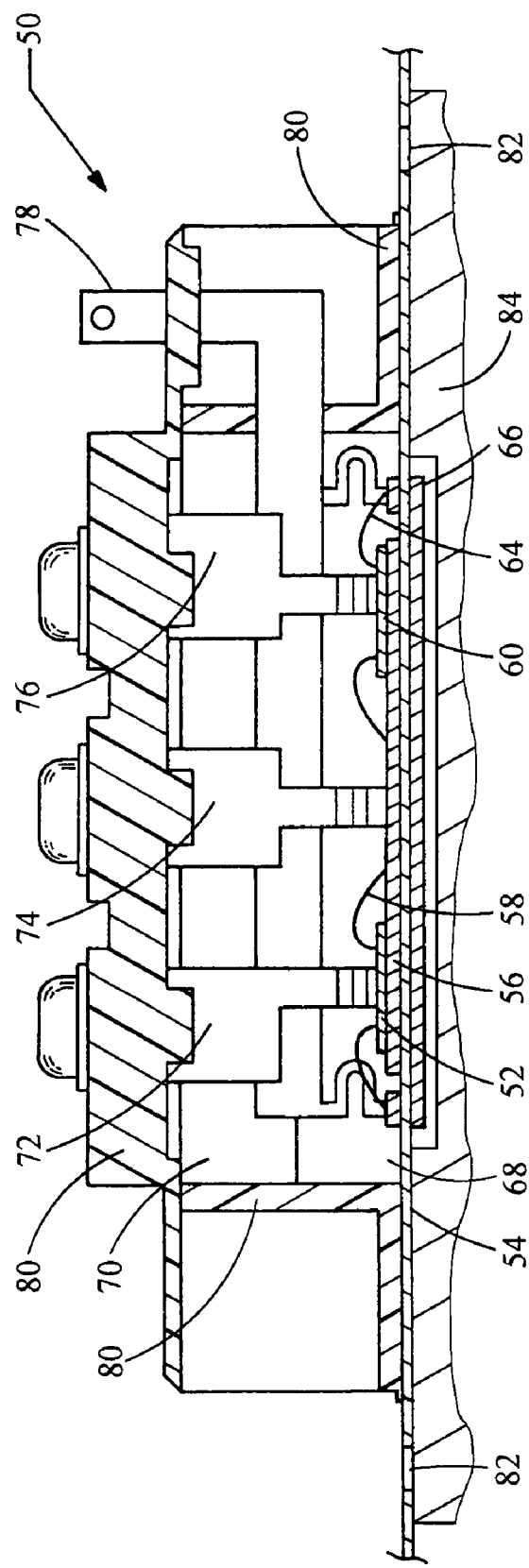
FIG. 2 is a side cutaway view of an IGBT module according to the present invention.

Referring now to the drawings, a power module embodying the principles of the present invention is illustrated therein and designated at 10. As its primary components, power module 10 includes a first semiconductor chip 52, a second semiconductor chip 60, and a substrate 54.

The first and second semiconductor chip 52, 60 are both attached to a single substrate 54. The substrate 54 is made of silicon nitride ($Si_3N_4$) and is between 0.5 and 1.5 mm thick. One method of attaching semiconductor chips 52, 60 to the substrate 54 is by soldering. The thermal coefficient of expansion of the silicon nitride substrate 54 is configured to match the coefficient of expansion of the first and second semiconductor chips 52, 60 thereby eliminating the need for multiple ceramic substrates while reducing the stress on the components and connections. Both $Si_3N_4$ substrate 54 and semiconductor chips 52 and 60 have thermal coefficients of expansion of 3 ppm/C. By matching the coefficients of expansion dies of 200 Amps or higher can be accommodated which was previously not possible. A conductive layer shown as copper layer 56 is attached to substrate 54. The copper layer 56 is between 0.1 and 0.5 mm thick and is preferably actively brazed onto the substrate 54. The copper layer 56 also includes a circuit pattern. The first semiconductor chip 52 is connected to the circuit pattern of copper layer 56 by wire bonds 58. Similarly, the second semiconductor chip 60 is connected to copper layer 56 by wire bonds 64. The substrate 54 also has a second copper layer 66 for grounding, mechanical balancing, and heat dissipation purposes.

The substrate 54 also serves as the foundation or support for power module 50. The substrate 54 also includes holes 82 for fastening power module 50 to a heat sink 84, other device or a circuit board. Leads 72, 74, 76, and 78 are attached or soldered to solder pads on the circuit pattern of copper layer 56 for electrically connecting power module 50 to external circuits or devices. To protect the components of power module 50, a silicone gel 68 is disposed over and surrounds the electrical components of power module 50. In addition, an epoxy resin 70 is placed on top of silicone gel 68 to further seal and protect the components. An epoxy resin case 80 is attached to the substrate 54 and further protects the components of power module 50 by providing structural stability to the module.

Therefore, silicon nitride has a thermal conductivity of 70 watts/M-C almost twice the value of alternative substrates. The single silicon nitride substrate 54 provides better thermomechanical continuity allowing better heat dissipation while also providing better resistance to warpage thereby increasing reliability. Further, the manufacture of the device is simplified using a single substrate and the substrate can be used to replace metal base plate (shown in FIG. 1). Therefore the cost and weight of the module is reduced by eliminating the multiple ceramic substrates and the base plate of the prior art designs.

Another aspect of the invention provides a method of manufacture for a power semiconductor module. The method begins with a unitary silicon nitride substrate. A copper layer including a circuit pattern is actively brazed onto the silicon nitride substrate. Semiconductor chips are attached to the silicon nitride substrate. In another aspect of the invention, at least one IGBT and at least one FRED semiconductor chips are attached to the silicon nitride substrate. The semiconductor chips are attached to the silicon nitride substrate using a high temperature soft solder, such as 95 Pb/2.5Sn/2.5Ag. Each of the semiconductor chips are wire bonded to the printed circuit pattern using aluminum wire. Power terminals are attached to the copper layer using a low temperature soft solder, such as 60 Pb/40Sn. Additional terminals are attached to the copper layer by manual soldering. Sides of the plastic housing are attached to the silicon nitride substrate using an epoxy adhesive. A layer of silicone gel is applied into the cavity formed by the plastic housing to cover and protect the semiconductor chips and wire bonds. An epoxy resin is applied into the cavity formed by the substrate and the plastic housing on top of the silicone gel. A plastic lid of the housing is attached by an epoxy adhesive.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

We claim:

1. A power module for switching applications comprising:
   a plurality of semiconductor chips;
   a housing wherein the housing has a cavity for receiving the plurality of semiconductor chips;
   a unitary silicon nitride substrate configured to mate with the housing and having a thermal coefficient of expansion substantially the same as the plurality of semiconductor chips and wherein the plurality of semiconductor chips are attached to the silicon nitride substrate; and
   a conductive layer including a circuit pattern attached to the silicon nitride substrate.

2. The power module according to claim 1, wherein the substrate is between 0.5 and 1.5 mm thick.

3. The power module according to claim 1, wherein at least one of the plurality of semiconductor chips is a IGBT semiconductor for chip.

4. The power module according to claim 1, wherein the at least one of the plurality of semiconductor chips is a FRED semiconductor chip.

5. The power module according to claim 4, wherein the conductive layer is a copper layer having a thickness of between 0.1 and 0.5 mm.

6. The power module according to claim 5, wherein the copper layer is actively brazed to the substrate.

7. The power module according to claim 5, wherein the plurality of semiconductor chips are wire bonded to the copper layer.

8. The power module according to claim 5, wherein the plurality of semiconductor chips are soldered to the copper layer.

9. The power module according to claim 1, wherein the substrate includes holes for fastening the substrate to the housing.

10. The power module according to claim 1, wherein the substrate is fastened to a heat sink.

11. A power module for switching applications comprising:
    at least one IGBT semiconductor chip;
    at least one FRED semiconductor chip;

a housing wherein the housing has a cavity for receiving the at least one IGBT and the at least one FRED semiconductor chips;

a unitary silicon nitride substrate configured to have a thermal coefficient of expansion substantially the same as the first and second semiconductor chips; and wherein the at least one IGBT and the at least one FRED semiconductor chips are attached to the silicon nitride substrate; and a conductive layer including a circuit pattern attached to the silicon nitride substrate.

12. The power module according to claim 11, wherein the substrate is between 1.5 and 1.5 mm thick.

13. The power module according to claim 11 wherein the conductive layer is a copper layer between 0.1 and 0.5 mm thick.

14. The power module according to claim 13, wherein the copper layer is actively brazed to the substrate.

15. The power module according to claim 13, wherein the at least one IGBT and the at least one FRED semiconductor chips are wire bonded to the copper layer.

16. The power module according to claim 13, wherein the at least one IGBT and the at least one FRED semiconductor chips are soldered to the copper layer.

17. The power module according to claim 11, wherein the substrate includes at least one holes and at least one fastener extending the at least one hole for securing the substrate to the housing.

18. The power module according to claim 11, wherein the substrate is fastened to a heat sink.

19. The power module according to claim 11, further comprising a housing fastened to the substrate.

* * * * *

UNITED STATES PATENT AND TRADEMARK OFFICE
CERTIFICATE OF CORRECTION

| | | |
|---|---|---|
| PATENT NO. | : 7,019,390 B2 | |
| APPLICATION NO. | : 10/771204 | |
| DATED | : March 28, 2006 | |
| INVENTOR(S) | : William W. Sheng et al. | |

It is certified that error appears in the above-identified patent and that said Letters Patent is hereby corrected as shown below:

<u>In the Claims</u>

Column 4, in claim 3, line 44, after "semiconductor" delete "for".

Column 5, in claim 12, line 13, after "substrate is between" delete "1.5" and substitute --0.5-- in its place.

Signed and Sealed this

First Day of August, 2006

JON W. DUDAS
*Director of the United States Patent and Trademark Office*